United States Patent
Chung et al.

(10) Patent No.: US 11,659,777 B2
(45) Date of Patent: May 23, 2023

(54) METHOD FOR MANUFACTURING SUPERCONDUCTOR COMPRISING MAGNESIUM DIBORIDE, AND SUPER-CONDUCTOR COMPRISING MAGNESIUM DIBORIDE

(71) Applicant: Korea Institute of Machinery & Materials, Daejeon (KR)

(72) Inventors: Kook Chae Chung, Changwon-si (KR); Seong Hoon Kang, Changwon-si (KR); Young Seok Oh, Busan (KR); Mahipal Ranot, Changwon-si (KR); Se Hoon Jang, Daejeon (KR); Kiran Prakash Shinde, Changwon-si (KR)

(73) Assignee: KOREA INSTITUTE OF MATERIALS SCIENCE, Gyeongsangnam-Do (KR)

( * ) Notice: Subject to any disclaimer, the term of this patent is extended or adjusted under 35 U.S.C. 154(b) by 1030 days.

(21) Appl. No.: 16/464,501

(22) PCT Filed: Nov. 29, 2016

(86) PCT No.: PCT/KR2016/013853
§ 371 (c)(1),
(2) Date: May 28, 2019

(87) PCT Pub. No.: WO2018/101496
PCT Pub. Date: Jun. 7, 2018

(65) Prior Publication Data
US 2021/0104657 A1    Apr. 8, 2021

(51) Int. Cl.
*H01L 39/12*    (2006.01)
*H01L 39/24*    (2006.01)

(52) U.S. Cl.
CPC .......... *H01L 39/12* (2013.01); *H01L 39/2403* (2013.01)

(58) Field of Classification Search
CPC . H01L 39/12; H01L 39/2403; H01L 39/2487; H01L 39/125; C04B 35/58057;
(Continued)

(56) References Cited

U.S. PATENT DOCUMENTS

2004/0204321 A1* 10/2004 Gumbel .............. H01L 39/2487
                                                                  505/100
2006/0093861 A1   5/2006 Pogrebnyakov et al.
(Continued)

FOREIGN PATENT DOCUMENTS

CN        1945789 A      4/2007
JP     2010-192142 A      9/2010
(Continued)

OTHER PUBLICATIONS

International Search Report PCT/ISA/210 for International Application No. PCT/KR2016/013853 dated May 30, 2017.
(Continued)

*Primary Examiner* — Hoang-Quan Ho
(74) *Attorney, Agent, or Firm* — Harness, Dickey & Pierce, P.L.C.

(57) ABSTRACT

According to an exemplary embodiment of the present invention, provided is a method for manufacturing a superconductor including magnesium diboride, the method including: a first mixture preparation step of preparing a first mixture including a boron powder and a liquid chlorinated hydrocarbon compound; a second mixture preparation step of preparing a second mixture including the first mixture and a magnesium powder; a molded body manufacturing step of manufacturing a molded body by pressurizing the second mixture; and a sintering step of sintering the molded body to manufacture a superconductor including magnesium diboride.

11 Claims, 8 Drawing Sheets

(58) Field of Classification Search
CPC ............... C04B 35/632; C04B 35/645; C04B 2235/5436; C04B 2235/5454; C04B 2235/656; C04B 2235/658
See application file for complete search history.

(56) References Cited

U.S. PATENT DOCUMENTS

| | | |
|---|---|---|
| 2011/0237440 A1 | 9/2011 | Goto et al. |
| 2012/0178631 A1 | 7/2012 | Suplinskas et al. |
| 2013/0012395 A1 | 1/2013 | Tanaka et al. |

FOREIGN PATENT DOCUMENTS

| | | |
|---|---|---|
| JP | 2013-016396 A | 1/2013 |
| KR | 10-0970369 | 7/2010 |
| WO | WO-2012/090236 A1 | 7/2012 |

OTHER PUBLICATIONS

Korean Office Action for Korean Patent Application No. 10-2017-7001070 dated Dec. 27, 2018.
Lu, Jun et al. "Low-temperature Synthesis of Superconducting Nanocrystalline $MgB_2$", Journal of Nanomaterials (2010) vol. 2010, document No. 191058, pp. 1-5.

\* cited by examiner

[Figure 1]
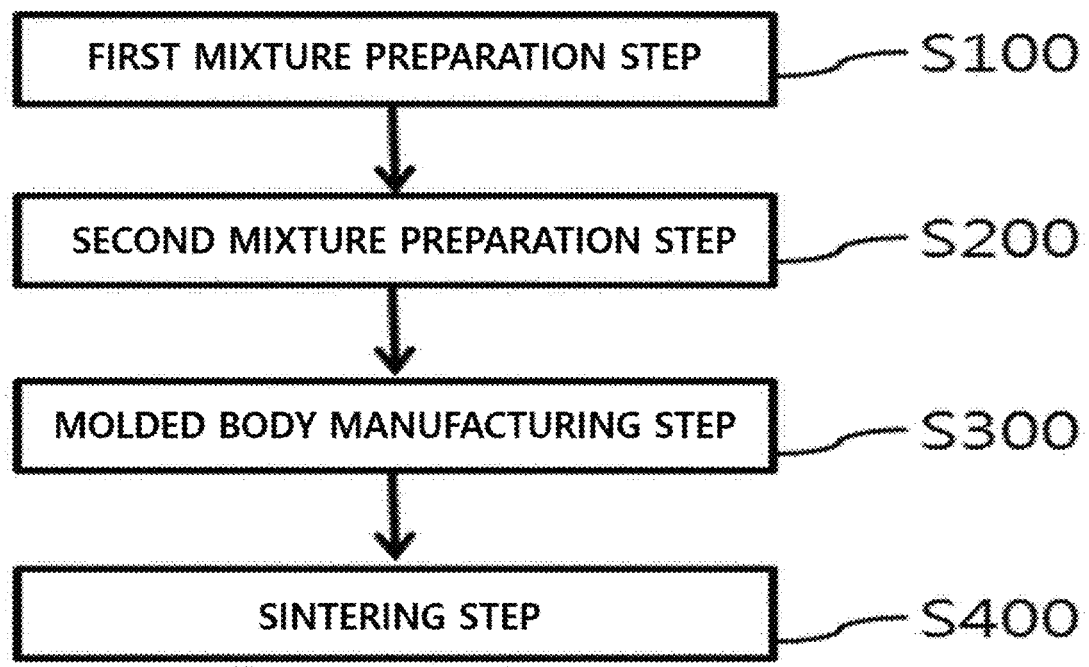

[Figure 2]
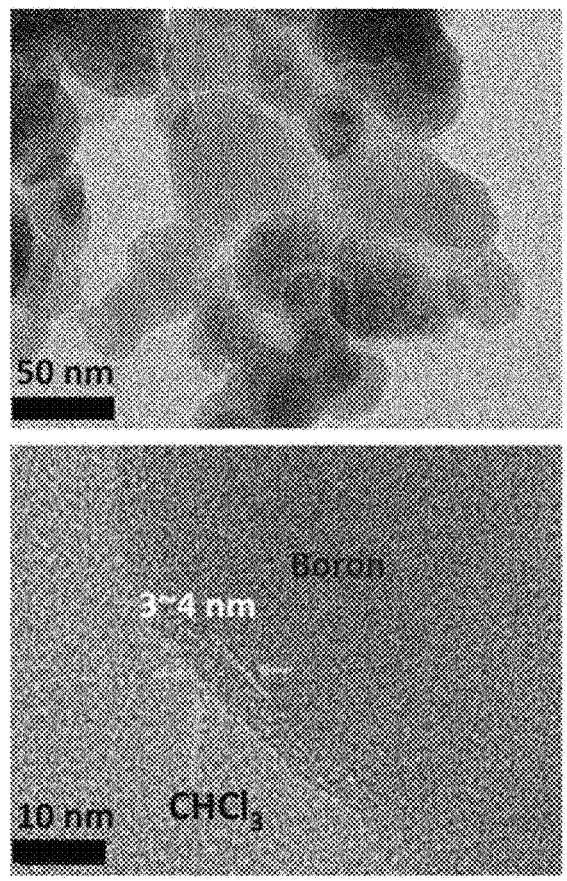

[Figure 3A]
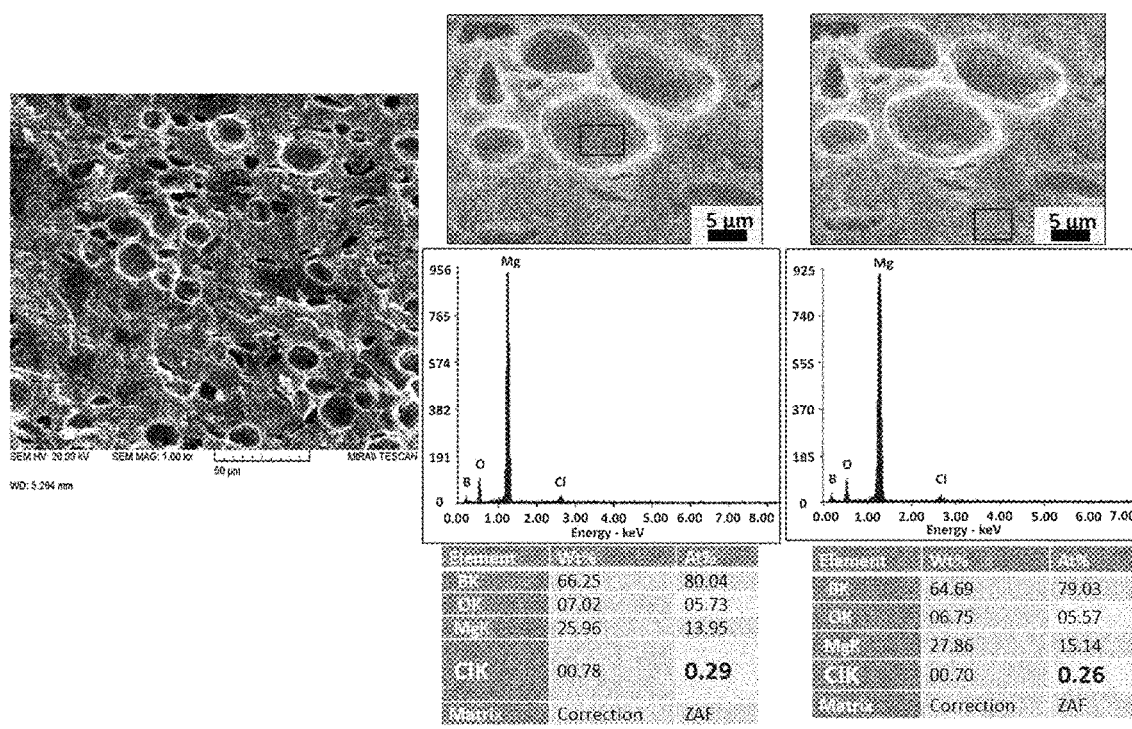

[Figure 3B]
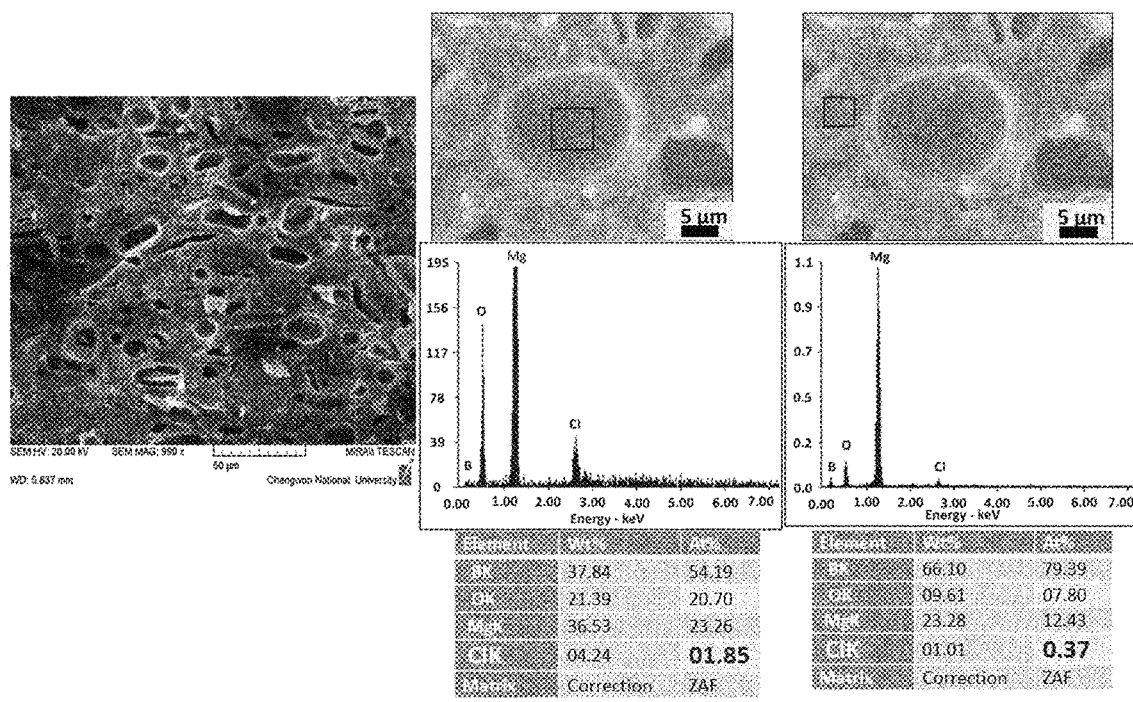

[Figure 4A]
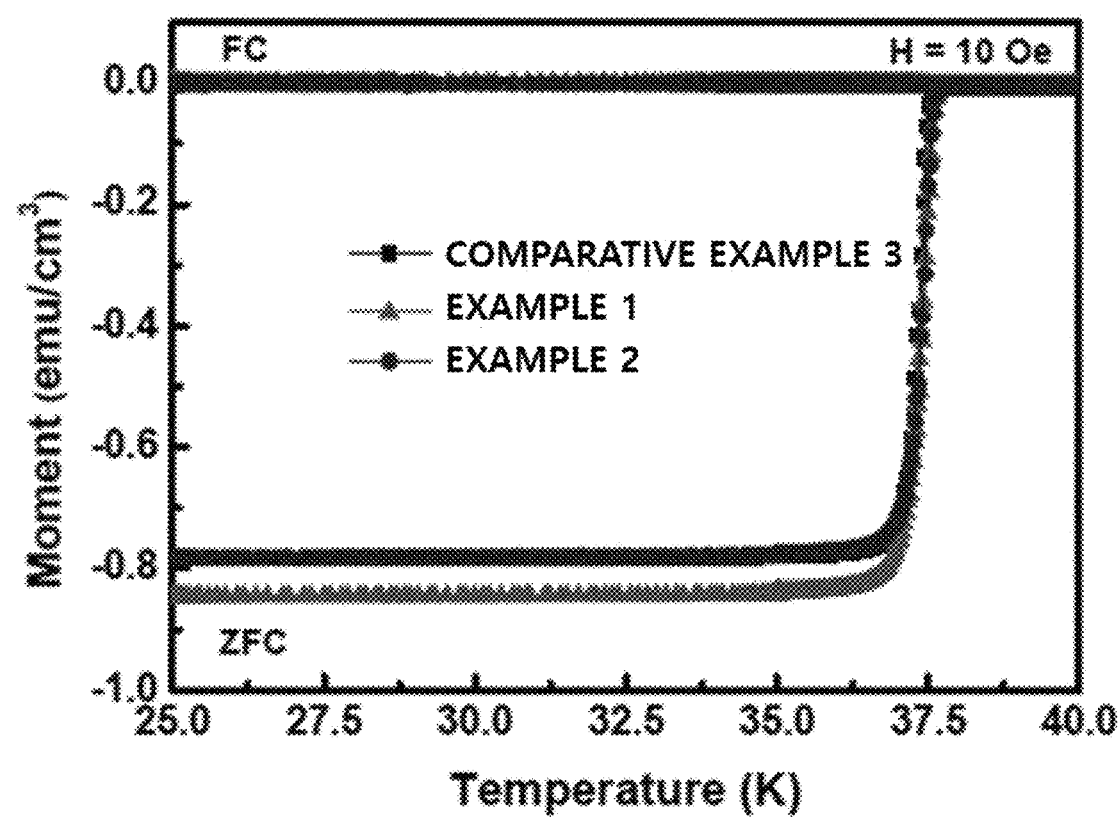

[Figure 4B]
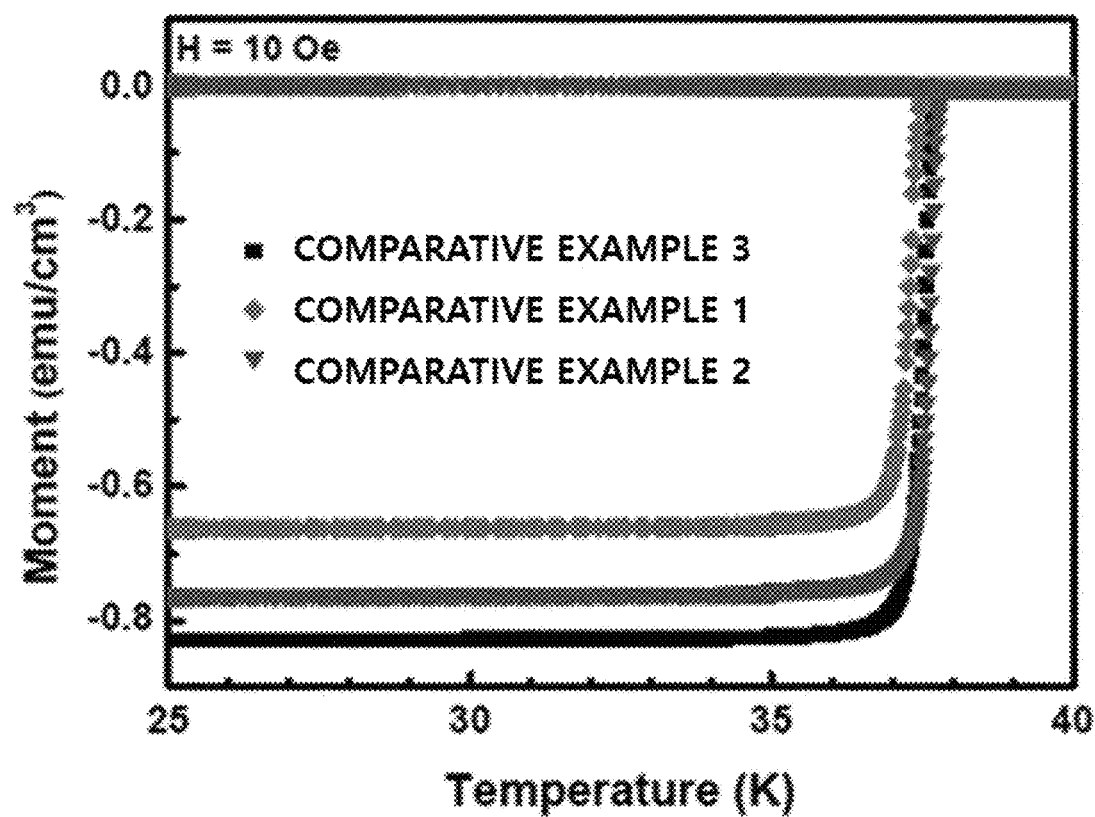

[Figure 5A]
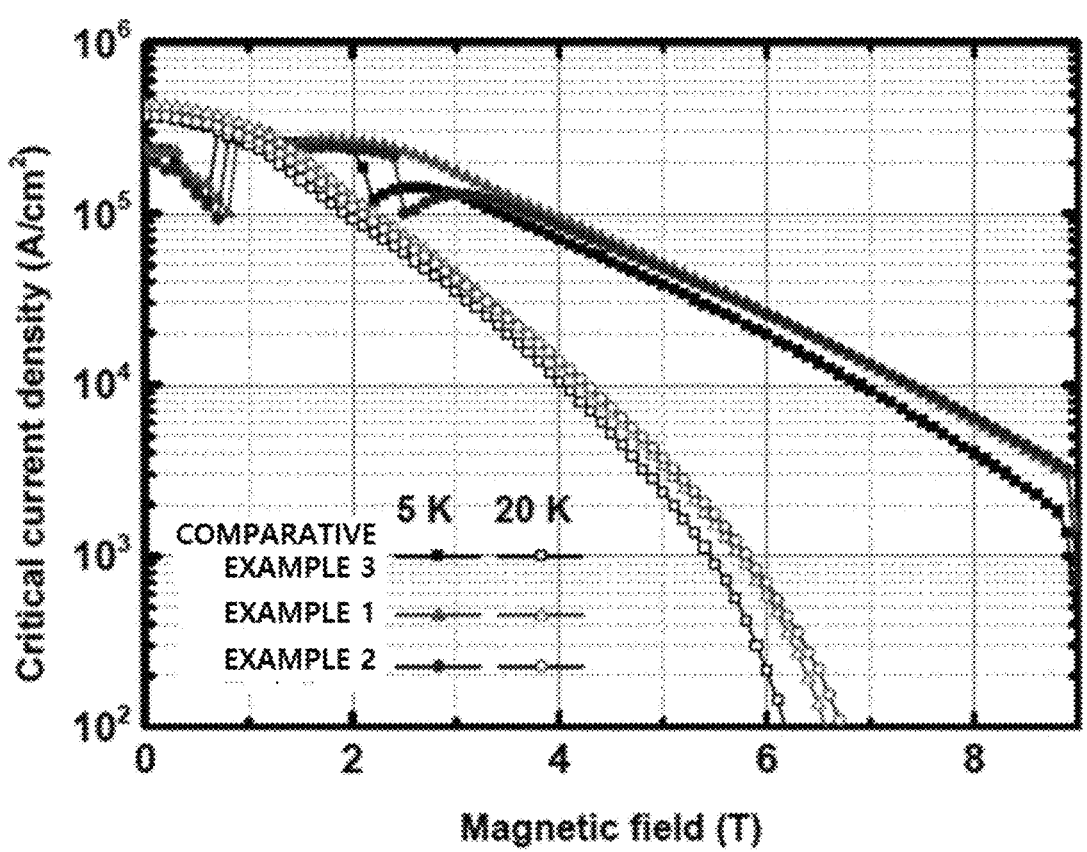

[Figure 5B]
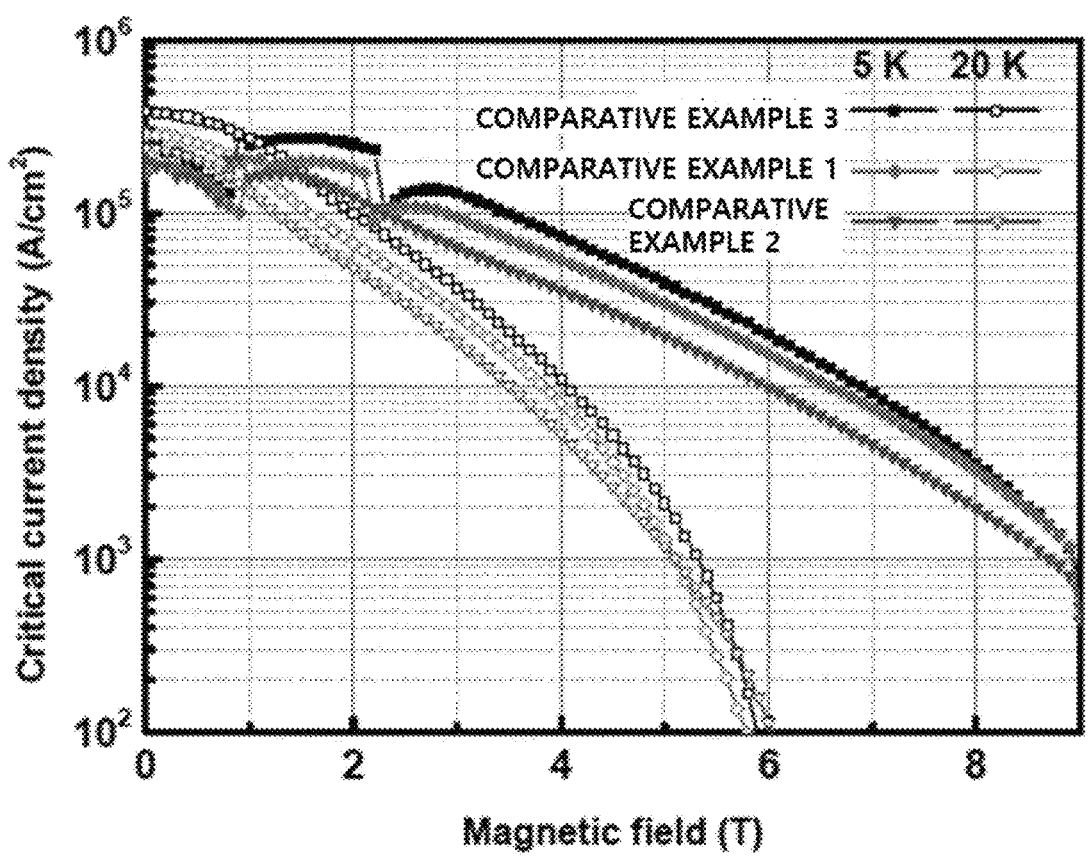

METHOD FOR MANUFACTURING SUPERCONDUCTOR COMPRISING MAGNESIUM DIBORIDE, AND SUPER-CONDUCTOR COMPRISING MAGNESIUM DIBORIDE

CROSS-REFERENCE TO RELATED APPLICATIONS

This application is a national phase under 35 U.S.C. § 371 of PCT International Application No. PCT/KR2016/013853 which has an International filing date of Nov. 29, 2016, the entire contents of each of which are hereby incorporated by reference.

TECHNICAL FIELD

The present invention relates to a method for manufacturing a superconductor including magnesium diboride and a superconductor including magnesium diboride.

BACKGROUND ART

Magnesium diboride ($MgB_2$) has been a subject of much interest and study globally in that magnesium diboride has a superconducting critical transition temperature of 39 K exceeding an absolute temperature of ~30 K which is the limit temperature of a metallic superconductor in the BCS theory that won the Nobel Prize in Physics in 1972, as claimed by US physicists John Bardeen, Leon Cooper, and John Robert Schrieffer (J. Nagamatsu, N. Nakagawa, T. Muranaka, Y. Zenitani, and J. Akimitsu, Nature, 401, pp.63-64 (2001)).

Further, since the magnesium diboride has a much simpler structure and is chemically more stable than high-temperature oxide-based superconductors that have been actively studied until now and the raw material for magnesium diboride is abundantly present on earth, there is an advantage in that the supply of magnesium diboride is available.

In addition, magnesium diboride can be cooled to a temperature that exhibits sufficient superconducting properties using an existing electric refrigerator without using liquid helium in that magnesium diboride has a superconducting transition temperature of 39 K, and the superconducting critical current density is so high that the economic advantage is significant and the application range thereof is very wide.

However, the critical current density value of magnesium diboride under a magnetic field is still lower to be applied to a practical applications. In particular, low critical current density under a magnetic field as compared to a low-temperature superconductor NbTi, a high-temperature superconductor YBCO, and the like at commercialization levels remain as problems to be solved for a long time.

Accordingly, it has been reported that it is possible to significantly improve critical current characteristics under a magnetic field by adding a carbon-based compound nano-powder such as nano-sized silicon carbide, carbon, carbon nanotube, and hydrocarbon to a magnesium diboride superconductor. In this case, it is known that lattice defects are formed by substituting a part of boron of magnesium diboride with carbon, and as a result, critical current characteristics of the superconductor under a magnetic field are improved.

However, since these additives are usually mixed in a powder state with a size of several tens nm, these additives easily aggregate with each other, so that it is difficult to uniformly distribute these additives, and therefore, these additives have a problem in that efficiency is low such as the failure to contribute to improving superconducting characteristics because a uniform reaction with a boron powder hardly occurs and only a part of the amount of additives is substituted into the crystal lattice of magnesium diboride.

DETAILED DESCRIPTION OF INVENTION

Technical Problem

A technical problem to be solved by the present invention has been contrived to solve the aforementioned problems, and is to provide a method capable of easily manufacturing a superconductor including magnesium diboride, in which superconducting characteristics are improved.

Technical Solution

According to an exemplary embodiment of the present invention, provided is a method for manufacturing a superconductor including magnesium diboride, the method including: a first mixture preparation step of preparing a first mixture including a boron powder and a liquid chlorinated hydrocarbon compound; a second mixture preparation step of preparing a second mixture including the first mixture and a magnesium powder; a molded body manufacturing step of manufacturing a molded body by pressurizing the second mixture; and a sintering step of sintering the molded body to manufacture a superconductor including magnesium diboride.

According to another exemplary embodiment of the present invention, provided is a superconductor including magnesium diboride manufactured by the manufacturing method according to an exemplary embodiment of the present invention.

According to still another exemplary embodiment of the present invention, provided is a superconductor includes magnesium diboride and chlorine.

Advantageous Effects

From the method for manufacturing a superconductor including magnesium diboride according to an exemplary embodiment of the present invention, the superconductor including magnesium diboride may be simply and easily manufactured a superconductor including magnesium diboride, in which superconducting properties are improved.

From the method for manufacturing a superconductor including magnesium diboride according to an exemplary embodiment of the present invention, the superconductor including magnesium diboride may be more effectively improved superconducting properties of a superconductor including magnesium diboride to be manufactured by determining the order of mixing a boron powder, a liquid chlorinated hydrocarbon compound, and a magnesium powder in advance.

According to another exemplary embodiment of the present invention, it is possible to provide a superconductor including magnesium diboride, in which a superconducting critical current density value is improved.

BRIEF DESCRIPTION OF DRAWINGS

FIG. 1 is a flowchart illustrating a method for manufacturing a magnesium diboride superconductor containing chlorine according to an exemplary embodiment of the present invention.

FIG. 2 is a view illustrating the TEM analysis results of the first mixtures manufactured in Examples 1 and 2 of the present invention.

FIG. 3A is a view illustrating the EDS analysis results of a superconductor sample manufactured in Example 2 of the present invention, and FIG. 3B is a view illustrating the EDS analysis results of a superconductor sample manufactured in Comparative Example 2.

FIG. 4A is a view illustrating the superconducting critical temperature values of the superconductor samples manufactured in Examples 1 and 2 and Comparative Example 3 of the present invention, and FIG. 4B is a view illustrating the superconducting critical temperature values of the superconductor samples manufactured in Comparative Examples 1 to 3.

FIG. 5A is a view illustrating the superconducting critical current density values of the superconductor samples manufactured in Examples 1 and 2 and Comparative Example 3 of the present invention, and FIG. 5B is a view illustrating the superconducting critical current density values of the superconductor samples manufactured in Comparative Examples 1 to 3.

BEST MODE

Hereinafter, examples of the present invention will be described in detail such that a person skilled in the art to which the present invention pertains can easily carry out the present invention with reference to the accompanying drawings. However, the present invention can be implemented in various different forms, and is not limited to the Examples described herein.

The term used in the present specification will be described briefly, and the present invention will be concretely described.

With respect to the terms used in the present invention, general terms currently and widely used are selected in consideration of function in the present invention, but the terms may vary according to an intention of a technician practicing in the art, jucicial precedents, an advent of a new technology, and the like. Further, in specific cases, there is also a term arbitrarily chosen by the applicant, and in this case, the meanings thereof will be described in detail in the corresponding description part of the invention. Accordingly, the term used in the present invention should not be defined merely as a simple name of the term, but should be defined based on the meaning of the term and overall content of the present invention.

When one part "includes" one constituent element throughout the present specification, unless otherwise specifically described, this does not mean that another constituent element is excluded, but means that another constituent element may be further included.

Hereinafter, the present invention will be described in detail with reference to accompanying drawings.

FIG. 1 is a flowchart illustrating a method for manufacturing a magnesium diboride superconductor containing chlorine according to an exemplary embodiment of the present invention.

According to an exemplary embodiment of the present invention, provided is a method for manufacturing a superconductor including magnesium diboride, the method including: a first mixture preparation step of preparing a first mixture including a boron powder and a liquid chlorinated hydrocarbon compound (S100); a second mixture preparation step of preparing a second mixture including the first mixture and a magnesium powder (S200); a molded body manufacturing step of manufacturing a molded body by pressurizing the second mixture (S300); and a sintering step of sintering the molded body to manufacture a superconductor including magnesium diboride (S400).

From the method for manufacturing a superconductor including magnesium diboride according to an exemplary embodiment of the present invention, the superconductor including magnesium diboride may be simply and easily manufactured a superconductor including magnesium diboride, in which superconducting properties are improved.

In the first mixture preparation step (S100) according to an exemplary embodiment of the present invention, a first mixture is prepared by mixing a boron powder and a liquid chlorinated hydrocarbon compound. By using the liquid chlorinated hydrocarbon compound, the boron powder and the liquid chlorinated hydrocarbon compound may be more uniformly mixed, and a reaction of boron included in the boron powder and the chlorinated hydrocarbon compound may be effectively induced. Further, according to an exemplary embodiment of the present invention, it is possible to overcome the non-uniformity of magnesium diboride due to an aggregation phenomenon which may occur when a nano-sized powder is used as an additive by using a liquid chlorinated hydrocarbon compound as the additive.

A first mixture according to an exemplary embodiment of the present invention may have a weight ratio of the boron power to the liquid chlorinated hydrocarbon compound of 1:0.2 to 1:25.

When the weight of the liquid chlorinated hydrocarbon compound included in the first mixture is less than the above range, the liquid chlorinated hydrocarbon compound and the boron powder are not uniformly mixed, so that unreacted boron may be included in the first mixture. It may be difficult to effectively improve the superconducting critical current density of the superconductor including magnesium diboride thereby. Further, when the weight of the liquid chlorinated hydrocarbon compound included in the first mixture is within the above range, the chlorinated hydrocarbon compound and boron may uniformly react.

Accordingly, in order to effectively improve the characteristics of the superconductor including magnesium diboride and reduce the costs of manufacturing the superconductor, a weight ratio of the boron powder to the liquid chlorinated hydrocarbon compound may be preferably 1:0.2 to 1:25.

In the second mixture preparation step (S200) according to an exemplary embodiment of the present invention, the first mixture and a magnesium powder are mixed. Superconducting characteristics of a superconductor including magnesium diboride to be manufactured may vary depending on the order of mixing the boron powder, the liquid chlorinated hydrocarbon compound, and the magnesium powder.

Specifically, when the first mixture is manufactured by mixing the boron powder and the magnesium powder and the second mixture is manufactured by mixing the first mixture and the liquid chlorinated hydrocarbon mixture, there may occur a problem in that a value of a superconducting critical current density of a superconductor including magnesium diboride to be manufactured is decreased. Due to the high reactivity of the chlorinated hydrocarbon compound and magnesium, the chlorinated hydrocarbon compound and magnesium may react, so that magnesium dichloride may be formed. Accordingly, the amount of magnesium capable of reacting with boron is decreased, and the formed magnesium dichloride, and the like may affect the reactivity of remaining magnesium and boron.

In contrast, according to an exemplary embodiment of the present invention, uniform doping may be induced by first mixing the boron powder and the liquid chlorinated hydrocarbon compound, thereby improving the doping effect. As the boron powder and the liquid chlorinated hydrocarbon compound are mixed, an amorphous layer including the chlorinated hydrocarbon compound may be formed on the surface of boron particles. The amorphous layer including the chlorinated hydrocarbon compound may have a thickness of 3 nm to 4 nm.

In addition, a secondary reaction may be suppressed in the process of manufacturing a superconductor including magnesium diboride by allowing a magnesium powder having good reactivity with moisture, oxygen, or the like in the air to react later on.

Accordingly, according to an exemplary embodiment of the present invention, superconducting characteristics of a superconductor including magnesium diboride to be manufactured may be more effectively improved by determining the order of mixing the boron powder, the liquid chlorinated hydrocarbon compound, and the magnesium powder in advance.

The first mixture and the second mixture according to an exemplary embodiment of the present invention may be in a solid phase. A first solid mixture may be manufactured by mixing the boron powder and the liquid chlorinated hydrocarbon compound, and a second solid mixture may be manufactured by mixing the first mixture and the magnesium powder. The solid first mixture and the solid second mixture may be, for example, in the form of clay or in the form of dough. The solid second mixture may be easily molded into a desired form.

The second mixture according to an exemplary embodiment of the present invention may have a molar ratio of the first mixture to the magnesium powder of 2:1. The molar ratio may be equivalent to a reaction ratio. For example, when the molar ratio of the first mixture to the magnesium powder is 2:1, boron included in the first mixture and magnesium included in the magnesium powder may react at a reaction ratio of 2:1.

When the magnesium is included at a molar ratio less than the above molar ratio in the second mixture, unreacted boron may be present in the second mixture. Further, when the magnesium is included at a molar ratio more than the above molar ratio in the second mixture, unreacted magnesium may be present in the second mixture. The unreacted boron and magnesium are present as impurities in a superconductor to be manufactured, so that a problem in that the characteristics of the superconductor is reduced may occur.

The boron powder according to an exemplary embodiment of the present invention may include 99% or more of boron powder particles having a particle size of 20 nm to 100 nm based on the entire boron powder particles. In addition, the magnesium powder according to an exemplary embodiment of the present invention may include 99% or more of magnesium powder particles having a particle size of 1 μm to 5 μm based on the entire magnesium powder particles.

When a boron powder having a particle size of less than 20 nm is used, an aggregation phenomenon among particles occurs, and as a result, there may occur problems in that the mixture is not uniformly mixed and the amount of oxygen on the surface due to the oxidation of the surface of the boron powder is increased. Furthermore, when a magnesium powder having a particle size of less than 1 μm is used, there may occur problems in that the magnesium powder is not easily handled due to the high reactivity of magnesium, an aggregation phenomenon among particles due to the small particle size occurs, and as a result, the mixture is not uniformly mixed, and the amount of oxygen on the surface due to the oxidation of the surface of the magnesium powder is increased.

According to an exemplary embodiment of the present invention, it is possible to improve critical current density characteristics of a superconductor including magnesium diboride to be manufactured by using a boron powder having a particle size of 100 nm or less and a magnesium powder having a particle size of 5 μm or less. When the particle sizes of the boron powder and the magnesium powder are less than the above numerical values, crystal grain sizes are decreased, so that the grain boundary is increased, and as a result, the critical current density value of the superconductor including magnesium diboride may be improved due to the grain boundary pinning effect.

Boron powder particles having a particle size of less than 20 nm, 20 nm to 100 nm, and more than 100 nm may be included in the boron powder. However, in order to prevent a problem which may occur when the particle size of the boron powder is less than 20 nm or more than 100 nm, boron powder particles having a particle size of 20 nm to 100 nm may be preferably 99% or more based on the entire boron powder particles included in the boron powder. Identically to those described above, magnesium powder particles having a particle size of 1 μm to 5 μm may be preferably 99% or more based on the entire magnesium powder particles included in the magnesium powder.

Further, the characteristics of the superconductor including magnesium diboride may be significantly affected by the particle size of the boron powder. Accordingly, in order to improve the characteristics of the superconductor, the particle size of the boron powder may be preferably 20 nm to 70 nm, and more preferably 20 nm to 50 nm.

Powder particles of another element in addition to the boron powder particles may be included in the boron powder. However, the boron powder according to an exemplary embodiment of the present invention may include 99% or more of boron powder particles based on the entire boron powder including boron powder particles and powder particles of another element. This may mean that the purity of the boron powder is 99% or more. Identically to those described above, the magnesium powder may include 99% or more of magnesium powder particles based on the entire magnesium powder, which may mean that the purity of the magnesium powder is 99% or more. The internal core density and connectivity of magnesium diboride to be manufactured may be improved by using a boron powder and a magnesium powder, which include powder particles within the above numerical ranges.

In addition, it is possible to reduce impurities other than magnesium diboride which is a superconducting material in a superconductor by using a boron powder and a magnesium powder which are highly pure, so that it is possible to suppress an area through which the superconducting current of the superconductor flows from being decreased.

Accordingly, the purities of the boron powder and the magnesium powder according to an exemplary embodiment of the present invention may be preferably 99% or more.

The liquid chlorinated hydrocarbon compound according to an exemplary embodiment of the present invention may be one selected from the group consisting of chloroform and carbon tetrachloride, or a combination thereof. As the liquid chlorinated hydrocarbon compound, chloroform or carbon tetrachloride may be used, and a combination of chloroform and carbon tetrachloride may be used.

As the liquid chlorinated hydrocarbon compound according to an exemplary embodiment of the present invention, it may be preferred that a compound including no oxygen or a small amount of oxygen is used, and it may be preferred that a chlorinated hydrocarbon compound present as a liquid at room temperature is used. In addition, according to an exemplary embodiment of the present invention, it is possible to use a brominated hydrocarbon compound or an iodinated hydrocarbon compound in addition to the chlorinated hydrocarbon compound. However, it may be preferred that a liquid compound is used as the brominated hydrocarbon compound and the iodinated hydrocarbon compound.

The boron powder according to an exemplary embodiment of the present invention includes oxygen and chlorine, a content of the oxygen is 0.3 at % to 0.7 at % with respect the boron powder, a content of the chlorine is 0.03 at % to 0.1 at % based on the boron powder, and the balance may be boron. The boron powder may include oxygen and chlorine, and another element in addition to oxygen and chlorine.

As for the boron powder according to an exemplary embodiment of the present invention, specifically, a content of the oxygen included in the boron powder may be 0.3 at % to 0.64 at % based on the boron powder, a content of the chlorine included in the boron powder may be 0.04 at % to 0.07 at % based on the boron powder, and the content of boron may be 99.32 at % to 99.63 at % based on the boron powder.

In order to improve superconducting characteristics of a superconductor including magnesium diboride to be manufactured, it may be preferred that the boron powder includes chlorine.

The molded body manufacturing step (S300) according to an exemplary embodiment of the present invention may pressurize the second mixture under a pressure of 1,000 MPa or less. After a second mixture is manufactured by mixing the first mixture and the magnesium powder for 30 minutes to 2 hours, a molded body may be made by pressurizing the second mixture under a pressure of 1,000 MPa or less. In order to uniformly mix the first mixture and the magnesium powder, it may be preferred that the first mixture and the magnesium powder are mixed for 30 minutes or more.

The sintering step (S400) according to an exemplary embodiment of the present invention may be performed at 600° C. to 1,000° C. for 10 minutes to 10 hours. Before the molded body manufactured by pressurizing the second mixture is sintered, the oxidation of magnesium may be minimized by sealing the second mixture in a vacuum state.

According to an exemplary embodiment of the present invention, magnesium may be melted into boron at 600° C. or more to form magnesium diboride. However, when the sintering temperature is more than 1,000° C., there may occur a problem in that magnesium diboride already formed itself is decomposed, so that it may be preferred that the molded body according to an exemplary embodiment of the present invention is sintered at 600° C. to 1,000° C.

Furthermore, the molded body may be sintered for 10 minutes to 10 hours. Magnesium diboride may be formed by sintering the molded body for 10 minutes or more, but when the molded body is sintered for 10 hours or more, an amount of magnesium oxide formed is increased, and thus may affect a superconducting effective cross-sectional area, so that it may be preferred that the molded body is sintered for 10 hours or less. However, since the time for the molded body to be sintered may vary depending on the sintering temperature, the sintering time may be shortened when the sintering temperature is high.

The sintering step (S400) according to an exemplary embodiment of the present invention may be performed in an inert gas atmosphere. It is possible to prevent the oxidation of a superconductor including magnesium diboride to be manufactured by sintering the molded body in an inert gas atmosphere. As the inert gas, an argon gas may be used, or a mixed gas in which an argon gas and a hydrogen gas are mixed may be used. It is possible to use a mixed gas in which the argon gas and the hydrogen gas are mixed at a volume ratio of 96:4.

According to an exemplary embodiment of the present invention, chlorine may be included in magnesium diboride of the superconductor to be manufactured. The chlorine may be included at the crystal grain boundary of the magnesium diboride particles or inside thereof, and may be included inside the lattice of magnesium diboride.

According to another exemplary embodiment of the present invention, provided is a superconductor including magnesium diboride manufactured by the manufacturing method according to an exemplary embodiment of the present invention.

The superconductor including magnesium diboride according to another exemplary embodiment of the present invention has an excellent superconducting critical current density value, and thus, may be applied to various fields such as NMR, MRI, superconducting power cables, and superconducting magnetic energy storage.

According to still another exemplary embodiment of the present invention, provided is a superconductor including magnesium diboride, in which the magnesium diboride includes chlorine.

Chlorine may be included in a superconductor including magnesium diboride to improve the characteristics of the superconductor. Specifically, a magnesium diboride superconductor including chlorine may have an improved superconducting critical current density as compared to a magnesium diboride superconductor including no chlorine. Accordingly, the superconductor including magnesium diboride according to still another exemplary embodiment of the present invention has an excellent superconducting critical current density value, and thus, may be applied to various fields such as NMR, MRI, superconducting power cables, and superconducting magnetic energy storage.

The content of chlorine of the superconductor including magnesium diboride according to still another exemplary embodiment of the present invention may be 0.1 at % to 2 at % based on the magnesium diboride. Specifically, the content of chlorine of the superconductor including magnesium diboride may be 0.1 at % to 0.3 at % based on the magnesium diboride. In order to provide a superconductor having an excellent superconducting critical temperature and an excellent superconducting critical current density, the content of chlorine of the superconductor including magnesium diboride may be preferably 0.1 at % to 0.3 at % based on the magnesium diboride.

According to still another exemplary embodiment of the present invention, the chlorine may be included at the crystal grain boundary of the magnesium diboride particles or inside thereof. Specifically, chlorine may be present inside magnesium diboride particles, at the crystal grain boundary of magnesium diboride particles, or inside and at the crystal grain boundary of magnesium diboride particles. Further, chlorine may also be present inside the lattice of magnesium diboride. The chlorine is present at the crystal grain boundary of or inside, inside the lattice of the magnesium diboride particles, so that when an external magnetic field is applied to a superconductor including magnesium diboride, the superconducting critical current density of the superconductor may be improved by reinforcing magnetic flux pinnin property of magnesium diboride.

MODE FOR INVENTION

Hereinafter, the present invention will be described in detail with reference to Examples for specifically describing the present invention. However, the Examples according to the present invention may be modified in various forms, and it is not interpreted that the scope of the present invention is limited to the Examples to be described below. The Examples of the present specification are provided for more completely explaining the present invention to the person with ordinary skill in the art.

EXAMPLE 1

A boron powder including 99% or more of boron powder particles having a particle size of 20 nm to 100 nm based on the entire boron powder particles, and having an oxygen content of 0.64 at %, a chlorine content of 0.04 at %, and a boron content of 99.32 at % was prepared. Further, chloroform was prepared as a liquid chlorinated hydrocarbon compound, and a magnesium powder having a particle size of 1 μm to 5 μm and including 99% or more of magnesium powder particles based on the entire magnesium powder particles was prepared.

A first mixture was manufactured by mixing 64 mg of the prepared boron powder and 100 μl of the prepared chloroform for about 10 minutes, and a second mixture was manufactured by mixing the prepared first mixture and 74 mg of the prepared magnesium powder for about 30 minutes. Thereafter, a molded body was manufactured by pressurizing the second mixture under a pressure of 1,000 MPa, and a superconductor sample including magnesium diboride was manufactured by sintering the manufactured molded body at 700° C. for about 1 hour.

EXAMPLE 2

A superconductor sample including magnesium diboride was manufactured in the same manner as in Example 1, except that 1,000 μl of chloroform was used.

COMPARATIVE EXAMPLE 1

The boron powder, chloroform, and magnesium powder which are the same as those in Example 1 were prepared. A first mixture was manufactured by mixing 64 mg of the prepared boron powder and 74 mg of the prepared magnesium powder for about 30 minutes, and a second mixture was manufactured by mixing the prepared first mixture and 100 μl of the prepared chloroform for about 10 minutes. Thereafter, a molded body was manufactured by pressurizing the second mixture under a pressure of 1,000 MPa, and a superconductor sample including magnesium diboride was manufactured by sintering the manufactured molded body at 700° C. for about 1 hour.

COMPARATIVE EXAMPLE 2

A superconductor sample including magnesium diboride was manufactured in the same manner as in Comparative Example 1, except that 1,000 μl of chloroform was used.

COMPARATIVE EXAMPLE 3

The boron powder and magnesium powder which are the same as those in Example 1 were prepared. A mixture was manufactured by mixing 64 mg of the prepared boron powder and 74 mg of the prepared magnesium powder for about 30 minutes, and a molded body was manufactured by pressurizing the manufactured mixture under a pressure of 1,000 MPa. Thereafter, a superconductor sample including magnesium diboride was manufactured by sintering the molded body at 700° C. for about 1 hour.

TEM Analysis

FIG. 2 is a view illustrating the TEM analysis results of the first mixtures manufactured in Examples 1 and 2 of the present invention.

Referring to FIG. 2, as a result of analyzing the first mixtures manufactured in Examples 1 and 2 by using a transmission electron microscope (TEM), it was confirmed that an amorphous layer including chloroform was formed on the surface of boron particles.

EDS Analysis

In order to confirm elements constituting the superconductor samples including magnesium diboride manufactured in Examples 1 and 2 and Comparative Examples 1 to 3, emitted energy was measured by Energy Dispersive X-ray Spectroscopy (EDS).

FIG. 3A is a view illustrating the EDS analysis results of a superconductor sample manufactured in Example 2 of the present invention, and FIG. 3B is a view illustrating the EDS analysis results of a superconductor sample manufactured in Comparative Example 2.

As observed in FIGS. 3A and 3B, it was confirmed that carbon was not included in the superconductors including magnesium diboride manufactured in Example 2 and Comparative Example 2 of the present invention. In the step of sintering the second mixture, carbon included in chloroform may be volatilized along with a predetermined amount of chlorine.

Further, it was confirmed that the content of elements included in the superconductor sample manufactured in Example 2 of the present invention was different from the content of elements included in the superconductor sample manufactured in Comparative Example 2. That is, it was confirmed that there occurred a difference in composition ratio of elements contained in a superconductor including magnesium diboride to be manufactured depending on the order of mixing the boron powder, the liquid chlorinated hydrocarbon compound, and the magnesium powder.

In the case of Comparative Example 2, as highly reactive chlorine and highly reactive magnesium react first, magnesium dichloride and the like may be formed, and may remain in the superconductor including magnesium diboride to be manufactured. The amount of magnesium capable of reacting with boron in the first mixture manufactured in Comparative Example 2 may be decreased thereby, so that the characteristics of the manufactured superconductor may be reduced, and the formed magnesium dichloride and the like may affect the reaction of magnesium with boron.

In contrast, in the case of Example 2 of the present invention, boron is a stable material as compared to highly reactive chlorine, and as boron is mixed with chloroform, it is possible to manufacture a first mixture in which an amorphous layer including chloroform on the surface of boron is formed. Thereafter, as the second mixture is manufactured and sintered, chlorine included in the amorphous layer may be stably present at the crystal grain boundary of magnesium diboride or inside thereof.

Measurement of Superconducting Critical Temperature

The superconducting critical temperatures of the superconductor samples including magnesium diboride manufactured in Examples 1 and 2 and Comparative Examples 1 to 3 were measured by using a vibrating sample magnetometer (VSM) of a physical property measurement system (PPMS) device.

FIG. 4A is a view illustrating the superconducting critical temperature values of the superconductor samples manufactured in Examples 1 and 2 and Comparative Example 3 of the present invention, and FIG. 4B is a view illustrating the superconducting critical temperature values of the superconductor samples manufactured in Comparative Examples 1 to 3.

The superconducting critical temperatures of the superconductor samples including magnesium diboride manufactured in Examples 1 and 2 and Comparative Examples 1 to 3 are shown in the following Table 1.

TABLE 1

|  | Example 1 | Example 2 | Comparative Example 1 | Comparative Example 2 | Comparative Example 3 |
|---|---|---|---|---|---|
| $T_c(K)$ | 37.5 | 37.5 | 37.3 | 37.6 | 37.5 |

As observed in FIGS. 4A and 4B and Table 1, it was confirmed that the superconducting critical temperature values of the superconductor samples including magnesium diboride manufactured in Examples 1 and 2 and Comparative Examples 1 to 3 are not significantly different from one another.

When magnesium diboride is manufactured by using a doping material including carbon, the superconducting critical temperature value of magnesium diboride is lowered as a boron atom of magnesium diboride is substituted with a carbon atom. In contrast, when the superconductor samples manufactured in Examples 1 and 2 of the present invention are compared with the superconductor sample manufactured in Comparative Example 1, the superconducting critical temperature values are not significantly decreased, so that it was confirmed that the superconductor including magnesium diboride manufactured by the method according to an exemplary embodiment of the present invention did not include carbon.

Measurement of Superconducting Critical Current Density

The superconducting critical current density values of the superconductor samples including magnesium diboride manufactured in Examples 1 and 2 and Comparative Examples 1 to 3 were measured at a temperature of 5 K and 20 K by converting the magnetization vs. field resulting values measured by a VSM option of a physical properties measurement system (PPMS) into a critical current density vs. field using a Bean's model.

FIG. 5A is a view illustrating the superconducting critical current density values of the superconductor samples manufactured in Examples 1 and 2 and Comparative Example 3 of the present invention, and FIG. 5B is a view illustrating the superconducting critical current density values of the superconductor samples manufactured in Comparative Examples 1 to 3.

As observed in FIG. 5A, it was confirmed that the superconductor including magnesium diboride manufactured according to an exemplary embodiment of the present invention had the improved superconducting critical current density values at a temperature of 5 K and 20 K, as compared to the superconductor manufactured in Comparative Example 3. In contrast, referring to FIG. 5B, it was confirmed that the superconductors including magnesium diboride manufactured in Comparative Examples 1 and 2 had the decreased superconducting critical current density values at a temperature of 5 K and 20 K, as compared to the superconductor manufactured in Comparative Example 3.

The invention claimed is:

1. A method for manufacturing a superconductor, the method comprising:
preparing a first mixture comprising a boron powder and a liquid chlorinated hydrocarbon compound;
preparing a second mixture comprising the first mixture and a magnesium powder;
manufacturing a molded body by pressurizing the second mixture; and
sintering the molded body to manufacture the superconductor including magnesium diboride.

2. The method of claim 1, wherein the first mixture has a weight ratio of the boron powder to the liquid chlorinated hydrocarbon compound of 1:0.2 to 1:25.

3. The method of claim 1, wherein the second mixture has a molar ratio of the first mixture to the magnesium powder of 2:1.

4. The method of claim 1, wherein the boron powder comprises 99% or more of boron powder particles having a particle size of 20 nm to 100 nm based on an entirety of the boron powder.

5. The method of claim 1, wherein the magnesium powder comprises 99% or more of magnesium powder particles having a particle size of 1 μm to 5 μm based on an entirety of the magnesium powder.

6. The method of claim 1, wherein
the boron powder comprises oxygen and chlorine,
a content of the oxygen is 0.3 at % to 0.7 at % based on the boron powder,
a content of the chlorine is 0.03 at % to 0.1 at % based on the boron powder, and
a balance is boron.

7. The method of claim 1, wherein the liquid chlorinated hydrocarbon compound is chloroform, carbon tetrachloride, or a combination of chloroform and carbon tetrachloride.

8. The method of claim 1, wherein the sintering is performed at 600° C. to 1000° C. for 110 minutes to 10 hours.

9. The method of claim 1, wherein the sintering is performed in an inert gas atmosphere.

10. A superconductor comprising:
magnesium diboride and chlorine,
wherein a content of the chlorine is 0.1 at % to 2 at % based on the magnesium diboride.

11. The superconductor of claim 10, wherein the chlorine is present at crystal grain boundary of the magnesium diboride or inside thereof.

* * * * *